(12) United States Patent
Weng et al.

(10) Patent No.: US 7,560,988 B2
(45) Date of Patent: Jul. 14, 2009

(54) INTEGRATED CIRCUIT SYSTEM FOR LINE REGULATION OF AN AMPLIFIER

(75) Inventors: Matthew Weng, San Ramon, CA (US); Charles Vinn, Milpitas, CA (US)

(73) Assignee: Micrel, Inc., San Jose, CA (US)

( * ) Notice: Subject to any disclaimer, the term of this patent is extended or adjusted under 35 U.S.C. 154(b) by 63 days.

(21) Appl. No.: 11/779,207

(22) Filed: Jul. 17, 2007

(65) Prior Publication Data
US 2009/0021306 A1 Jan. 22, 2009

(51) Int. Cl.
*H03F 3/45* (2006.01)
(52) U.S. Cl. .................................. 330/260
(58) Field of Classification Search ............. 330/260
See application file for complete search history.

(56) References Cited

U.S. PATENT DOCUMENTS

| 5,430,409 | A | 7/1995 | Buck et al. |
| 6,359,427 | B1 | 3/2002 | Edwards et al. |
| 6,437,645 | B1* | 8/2002 | Ivanov et al. ............. 330/255 |
| 7,151,363 | B1 | 12/2006 | Scott et al. |
| 7,180,371 | B2 | 2/2007 | Daniel |

* cited by examiner

*Primary Examiner*—Steven J Mottola
(74) *Attorney, Agent, or Firm*—Mikio Ishimaru

(57) ABSTRACT

An integrated circuit system is provided including forming a differential pair; reducing a mismatch in the differential pair by: coupling an amplifier to the differential pair; and coupling a local feedback network to the amplifier in which referencing the local feedback network includes coupling a first voltage; and driving an output transistor by the amplifier.

18 Claims, 3 Drawing Sheets

INTEGRATED CIRCUIT SYSTEM FOR LINE REGULATION OF AN AMPLIFIER

TECHNICAL FIELD

The present invention relates generally to a power system of an integrated circuit, and more particularly to a system for managing the line regulation of an amplifier of an integrated circuit.

BACKGROUND ART

In today's integrated circuit technology, on chip amplifiers play a key role in managing small signal delivery and usage. As an example, wireless communication devices are a combination of several functions that used to be separate devices. Currently, a digital camera is commonly embedded in a cellular telephone. There may also be a personal music player imbedded in the cellular telephone that allows the user to listen to music while not engaged in a telephone conversation. Some devices add wireless internet access and a personal data assistant in the same package. These devices challenge the design of power structures that support them. Each function puts additional drain on the batteries and induces variation in the level of power that is delivered to each. On chip amplifiers that utilize the fluctuating power may be subject to dynamic changes in performance due to the fluctuations.

Continuing with the example, wireless functions in the cellular telephone detect and amplify minute signals that are susceptible to being missed if the regulation of the amplifier line is not maintained. Most signal loss is not recoverable and may be detected by the user as a drop-out of the information being transferred. In the case of a cellular telephone call, the signal drop-out may sound like a "bad connection". It may actually be the result of poor line regulation in the amplifier due to the demands on the power system.

Small signal systems classically rely on amplifiers utilizing pairs of transistors connected in a differential configuration. Since one of the transistors in the differential pair may be connected to an output driver while the other is not, the differential pair may be susceptible to variations in supply voltage. This condition may be caused by the difference in voltage at the drains of the transistors that make-up the differential pair. As an example, the drain of one of the transistors in the differential pair may be equal to $V_{DD}$-$V_{GS}$ while the other transistor in the differential pair that is coupled to an output transistor may be equal to $V_{OUT}$+$V_{GS}$. Since the voltage at the drain of the first transistor is dependent upon $V_{DD}$ while the voltage on the drain second transistor is not dependent on $V_{DD}$, any variation in $V_{DD}$ will contribute directly to a power supply dependent offset in the amplifier.

Certain configurations of the differential pair may provide a reduced susceptibility to the power supply dependent offset. If the differential pair is configured as a current mirror in a cascode structure, it will display less power supply dependent offset. Unfortunately this configuration may not supply sufficient output control to eliminate the power supply dependent offset. If extremely tight line regulation is required by the application, then even a cascode configured current mirror may not supply sufficient isolation from the power supply dependent offset.

It is possible to implement an output stage that couples to the differential pair and allows the drains of both of the transistors to be referenced to $V_{DD}$-$V_{GS}$. Though this option is possible, it is not always practical because it introduces another gain stage and restricts the current in the output stage relative to that of the input differential pair.

Thus, a need still remains for an integrated circuit system for line regulation of an amplifier. In view of the number of mobile devices that must manage multiple functions with only a battery as their power source, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including forming a differential pair; reducing a mismatch in the differential pair by: coupling an amplifier to the differential pair; and coupling a local feedback network to the amplifier in which referencing the local feedback network includes coupling a first voltage; and driving an output transistor by the amplifier.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
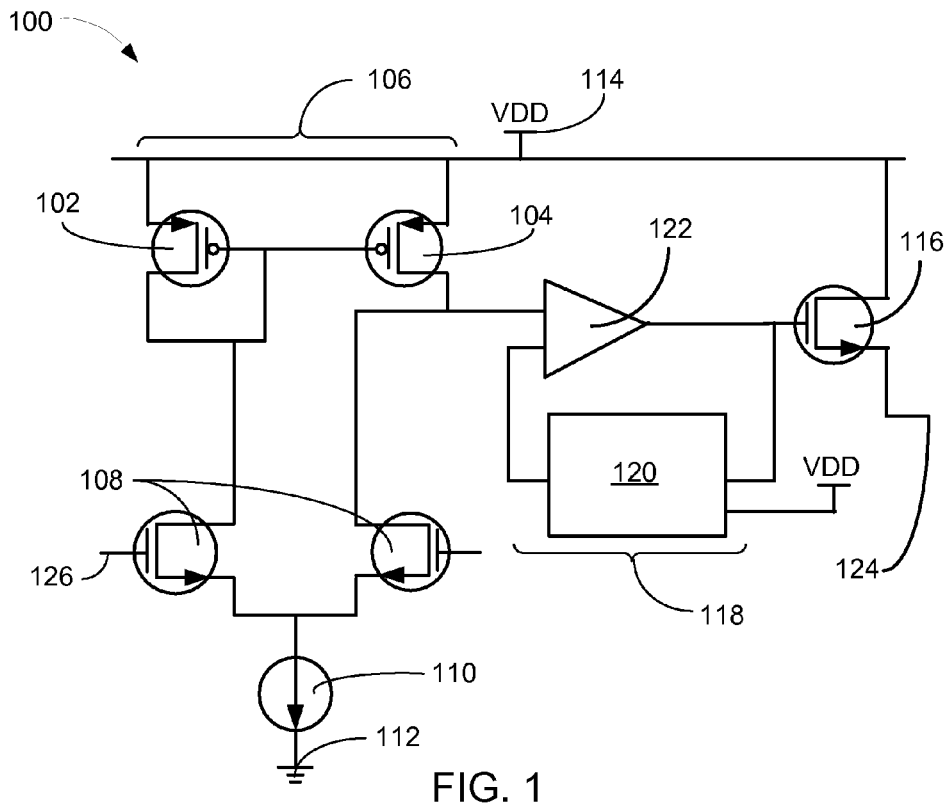
FIG. 1 is a functional block diagram of an integrated circuit system for line regulation of an amplifier in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a functional block diagram of an integrated circuit system 100 for line regulation of an amplifier in an embodiment of the present invention. The functional block diagram of the integrated circuit system 100 includes a first P-channel transistor 102, such as a metal oxide semiconductor field effect transistor (MOSFET), a bipolar junction transistor (BJT), or a junction field effect transistor (JFET), coupled to a second P-channel transistor 104, of a substantially similar type as the first P-channel transistor 102. The first P-channel transistor 102 and the second P-channel transistor 104 are configured to form a current mirror 106. In any current mirror 106 a mismatch of characteristics is likely to occur due to loading differences these loading differences may cause voltage differences applied to an input differential pair 108.

The input differential pair 108, such as an N-channel metal oxide semiconductor field effect transistor (MOSFET), a bipolar junction transistor (BJT), or a junction field effect transistor (JFET), is coupled between the current mirror 106 and a current source 110. The current source 110 is further coupled to a second voltage 112, such as a ground node. A first voltage 114 may be coupled to a source of the first P-channel transistor 102, the source of the second P-channel transistor, and the drain of an output transistor 116, such as an N-channel metal oxide semiconductor field effect transistor (MOSFET), a bipolar junction transistor (BJT), or a junction field effect transistor (JFET).

An amplification stage 118 is coupled between the second P-channel transistor 104 and the output transistor 116. The amplification stage 118 includes a local feedback network 120 and an amplifier 122. The local feedback network 120 may be adjusted to limit the gain introduced into the main loop. The amplification stage 118 may have the DC bias point set by the local feedback network 120 dependent on $V_{DD}$. The local feedback network 120 may be designed to minimize the difference in the drain voltage of the current mirror 106 and therefore the differential pair 108.

A $V_{OUT}$ node 124 may maintain a constant voltage without being effected by the variation in power supply voltage $V_{DD}$. An input signal 126 coupled to the gate of the differential pair 108 may be accurately amplified and presented on the $V_{OUT}$ node 124.

Figure 2:
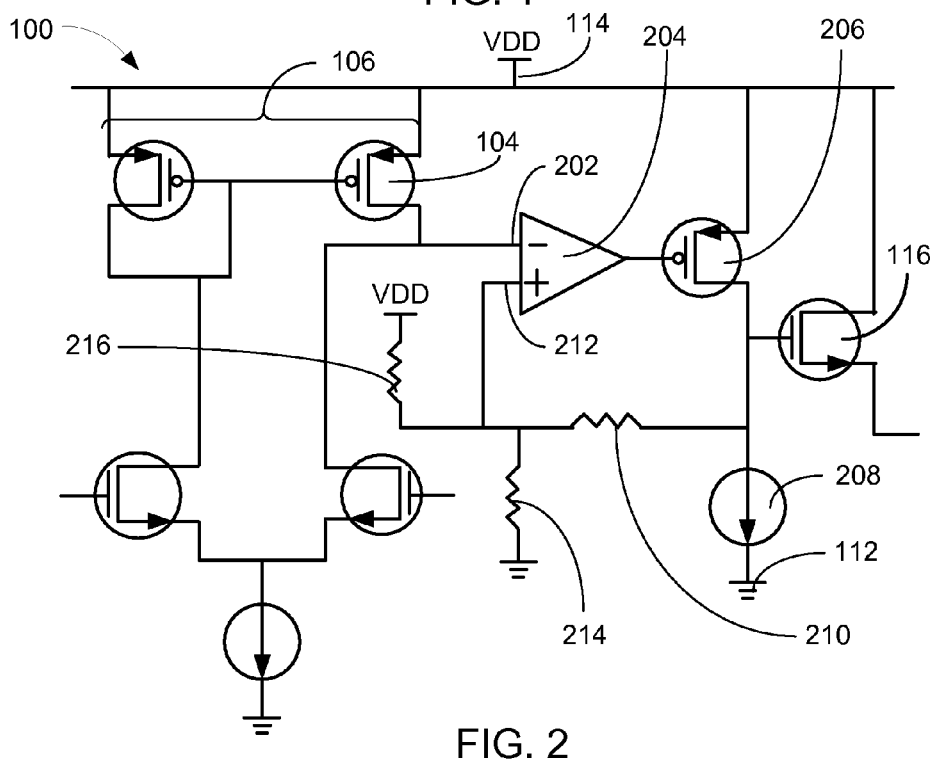
FIG. 2 is a schematic diagram of the integrated circuit system in an embodiment of the present invention.

Referring now to FIG. 2, therein is shown a schematic diagram of the integrated circuit system 100 in an embodiment of the present invention. The schematic diagram of the integrated circuit system 100 depicts the current mirror 106 with the second P-channel transistor 104 coupled to a minus input 202 of an operational amplifier 204. A buffering transistor 206, such as a P-channel transistor, may be coupled to the output of the operational amplifier 204. The buffering transistor 206 may act as a level translator to drive the output transistor 116.

A second current source 208 may be coupled between the drain of the buffering transistor 206 and the second voltage 112. A first resistor (R1) 210 is coupled between the drain of the third P-channel transistor 206 and a positive input 212 of the operational amplifier 204. A second resistor (R2) 214 may be coupled between the positive input 212 and the second voltage 112. A third resistor (R3) 216 may be coupled between the positive input 212 and the first voltage 114. The first resistor (R1) 210, the second resistor (R2) 214, and the third resistor (R3) 216 form a network that provides negative feedback to the operational amplifier 204 and establishes a DC bias for the positive input 212.

By carefully selecting the values of the first resistor (R1) 210, the second resistor (R2) 214, and the third resistor (R3) 216, the voltage differences between drain of the first P-channel transistor 102 and the drain of the second P-channel transistor 104 may be minimized. The voltage at the drain of the first P-channel transistor 102 will be $V_{DD}$-$V_{GS}$, where $V_{GS}$ represents the voltage drop from the source to the gate of the first P-channel transistor 102. The voltage at the drain of the second P-channel transistor 104 may be calculated by equation 1 below.

$$\frac{R1 \times R2}{R1 + R2 + R3} \times V_{DD} + (V_{OUT} + V_{GS3}) \times \frac{R2 \times R3}{R1 + R2 + R3} \qquad (1)$$

This configuration provides a tracking ability for the drain voltage of the second P-channel transistor 104. As $V_{DD}$ varies the voltage at the drain of the first P-channel transistor 102 will follow in a linear fashion. The voltage at the drain of the second P-channel transistor 104 will scale to track $V_{DD}$ as shown in equation 1 above. The term $V_{GS3}$ represents the voltage across the source to gate of the output transistor 116. By careful selection of the values for the first resistor (R1) 210, the second resistor (R2) 214, and the third resistor (R3) 216, the variation between the drain of the first P-channel transistor 102 and the drain of the second P-channel transistor 104 may be reduced. This method may be used to reduce a mismatch between the first P-channel transistor 102 and the second P-channel transistor 104 by the factor $$\frac{R1 \times R2}{R1 + R2 + R3} \times V_{DD}.$$

While the above example utilizes the first P-channel transistor 102 for the current mirror 106, this is for demonstration purposes only. The current mirror 106 could include N-channel transistors or bi-polar transistors as well.

Figure 3:
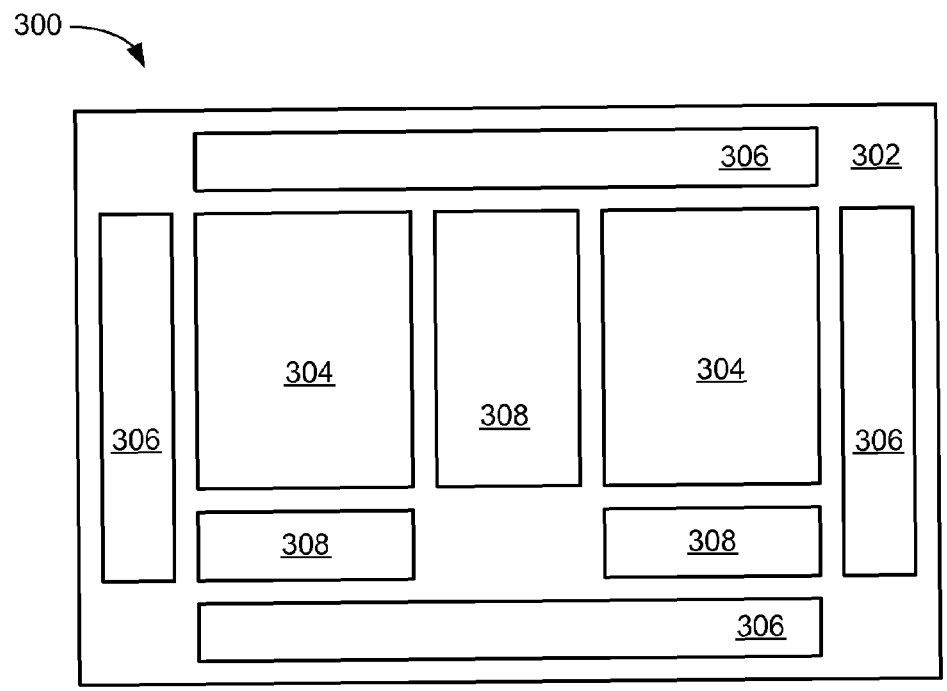
FIG. 3 is a plan view of an integrated circuit in an embodiment of the present invention.

Referring now to FIG. 3, therein is shown a plan view of an integrated circuit 300 in an embodiment of the present invention. The integrated circuit 300 is a semiconductor device having the integrated circuit system 100 for line regulation of an amplifier. The integrated circuit 300 commonly includes the semiconductor substrate 302 in which one or more high-density core regions 304 and one or more low-density peripheral portions 306 are formed.

The high-density core regions 304 typically include one or more amplifiers 308 for boosting the amplitude of small signals that must traverse the semiconductor substrate 302. Low-density peripheral portions typically include input/output (I/O) circuitry and programming circuitry for individually and selectively addressing the functions in the high density core regions 304.

For illustrative purposes, the device 300 is shown as a memory device, although it is understood that the device 300 may be other types of semiconductor devices having other functional blocks, such as a digital logic block, a processor, or other types of memories. Also for illustrative purposes, the device 300 is described as a single type of semiconductor device, although it is understood that the device 300 may be a multi-chip module utilizing the present invention with other types of devices of similar or different semiconductor technologies, such as power devices or micro-electro-mechanical systems (MEMS).

Figure 4:
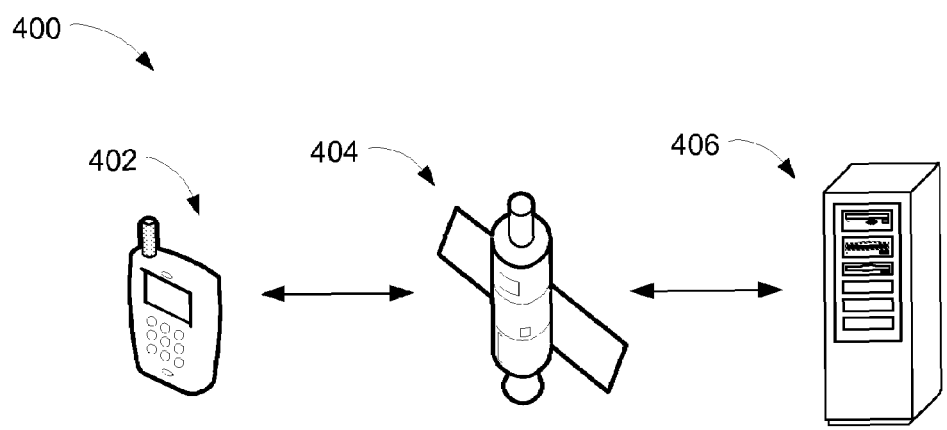
FIG. 4 are electronics systems in an embodiment of the present invention.

Referring now to FIG. 4, therein is shown an electronic system 400 in an embodiment of the present invention. A smart phone 402, a satellite 404, and a compute system 406 are examples of the electronic system 400 using the present invention. The electronic system 400 may be any system that performs any function for the creation, transportation, storage, and consumption of information. For example, the smart phone 402 may create information by transmitting voice to the satellite 404. The satellite 404 is used to transport the information to the compute system 406. The compute system 406 may be used to store the information. The smart phone 402 may also consume information sent from the satellite 404. A printed circuit board 408 containing the integrated circuit system 100 for line regulation of an amplifier, of the present invention may be present in any of the electronic systems 400 indicated above. It is understood that these electronic systems 400 are by way of an example and other electronic systems that utilize the integrated circuit system 100 for line regulation of an amplifier will be obvious to those skilled in the art.

Figure 5:
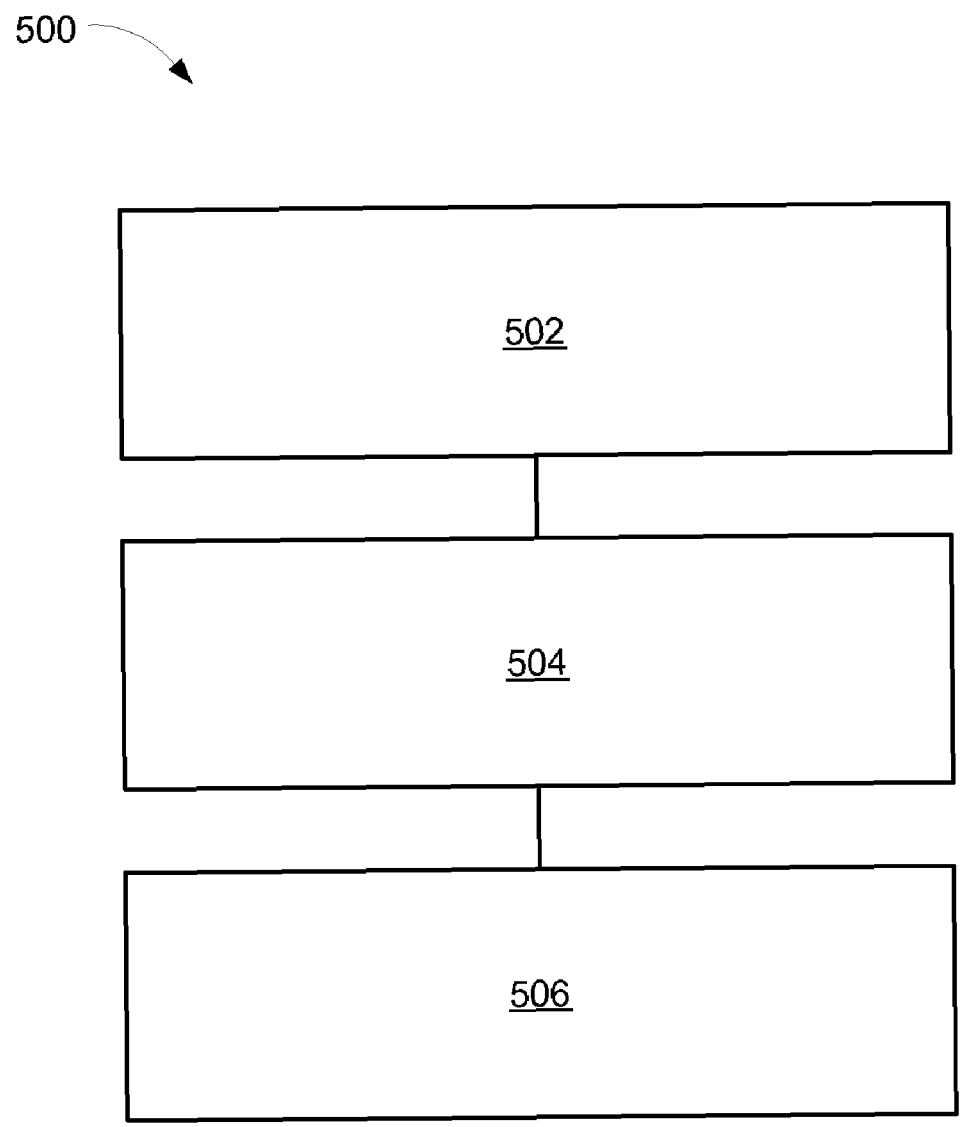
FIG. 5 is a flow chart of a system for an integrated circuit system for line regulation of an amplifier in an embodiment of the present invention.

Referring now to FIG. 5, therein is shown a flow chart of an integrated circuit system 500 for manufacturing the integrated circuit system for line regulation of an amplifier, in an embodiment of the present invention. The system 500 includes forming a differential pair in a block 502; reducing a mismatch in the differential pair by: coupling an amplifier to the differential pair; and coupling a local feedback network to the amplifier in which referencing the local feedback network includes coupling a first voltage in a block 504; and driving an output transistor by the amplifier in a block 506.

In greater detail, a system to manufacture the integrated circuit system for line regulation of an amplifier, according to an embodiment of the present invention, is performed as follows:

1. Forming a differential pair on a semiconductor substrate. (FIG. 3)
2. Reducing a mismatch in the differential pair by: coupling an amplifier to the differential pair includes coupling a negative input of the amplifier; and coupling a local feedback network to the amplifier in which referencing the local feedback network includes coupling a first voltage and coupling the local feedback network to a positive input of the amplifier. (FIG. 2)
3. Driving an output transistor by the amplifier. (FIG. 1)

It has been discovered that the present invention thus has numerous aspects.

A principle aspect that has been discovered is that the present invention provides a reliable procedure to reduce the mismatch in a differential pair that may be used for amplification of small signals.

Another aspect is that a high degree of precision is possible between the integrated resistors, thus providing an accurate DC bias and feedback scaling mechanism.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system for line regulation of an amplifier, of the present invention furnishes important and heretofore unknown and unavailable solutions, capabilities, and functional aspects for controlling the amplification of small signals, such as those found in communication and position detection devices. The resulting processes and configurations are straightforward, cost-effective, uncomplicated, highly versatile and effective, can be surprisingly and unobviously implemented by adapting known technologies, and are thus readily suited for efficiently and economically manufacturing electronic devices fully compatible with conventional manufacturing processes and technologies.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit system comprising:
    forming a differential pair;
    reducing a mismatch in the differential pair by:
        coupling an amplifier to the differential pair; and
        coupling a local feedback network to the amplifier in which referencing the local feedback network includes: forming a first resistor for providing a feedback path to the amplifier, coupling a second resistor to the amplifier and the first resistor for providing a reference from a second voltage, and coupling a third resistor to the amplifier, the first resistor, and the second resistor for providing the reference from a first voltage; and
    driving an output transistor by the amplifier.

2. The system as claimed in claim 1 further comprising coupling a buffering transistor between the differential pair and the output transistor.

3. The system as claimed in claim 1 wherein coupling the local feedback network includes coupling a buffering transistor.

4. The system as claimed in claim 1 further comprising assembling an electronic system having the integrated circuit system.

5. An integrated circuit system comprising:
    forming a differential pair on a semiconductor substrate;
    reducing a mismatch in the differential pair by:
        coupling an amplifier to the differential pair includes coupling a negative input of the amplifier; and
        coupling a local feedback network to the amplifier in which referencing the local feedback network includes: forming a first resistor for providing a feedback path to the amplifier includes providing a negative feedback, coupling a second resistor to the amplifier and the first resistor for providing a reference from a second voltage, coupling a third resistor to the amplifier, the first resistor, and the second resistor for providing the reference from a first voltage; and
    driving an output transistor by the amplifier.

6. The system as claimed in claim 5 further comprising coupling a buffering transistor between the differential pair and the output transistor for driving the output transistor.

7. The system as claimed in claim 5 in which coupling the local feedback network includes:
    establishing a DC bias for the amplifier by the first resistor, the second resistor, the third resistor, and the first voltage; and
    forming a current source in the local feedback network for limiting a feedback current going to the amplifier.

8. The system as claimed in claim 5 wherein coupling the local feedback network includes coupling a buffering transistor for controlling a gate voltage on the output transistor.

9. The system as claimed in claim 5 in which forming a differential pair includes forming a current mirror, a cascode connection, or a combination thereof.

10. An integrated circuit system comprising:
   a differential pair;
   an amplifier, for reducing mismatch in the differential pair, coupled to the differential pair;
   a local feedback network coupled to the amplifier in which the local feedback network includes:
      a first resistor for providing a feedback path to the amplifier,
      a second resistor coupled to the amplifier and the first resistor for providing a reference from a second voltage, and
      a third resistor coupled to the amplifier, the first resistor, and the second resistor for providing the reference from a first voltage; and
   an output transistor driven by the amplifier.

11. The system as claimed in claim 10 further comprising a buffering transistor between the differential pair and the output transistor.

12. The system as claimed in claim 10 wherein the local feedback network includes a buffering transistor.

13. The system as claimed in claim 10 further comprising an electronic system having the amplifier therein.

14. The system as claimed in claim 10 further comprising:
   a semiconductor substrate having the differential pair formed thereon;
   a negative input of the amplifier coupled to the differential pair; and
   a positive input of the amplifier coupled to the local feedback network.

15. The system as claimed in claim 14 further comprising a buffering transistor between the differential pair and the output transistor for driving the output transistor.

16. The system as claimed in claim 14 in which the local feedback network includes:
   a DC bias for the amplifier from the first resistor, the second resistor, the third resistor, and the first voltage; and
   a current source in the local feedback network for limiting a feedback current going to the amplifier.

17. The system as claimed in claim 14 wherein the local feedback network includes a buffering transistor for controlling a gate voltage on the output transistor.

18. The system as claimed in claim 14 in which the differential pair includes a current mirror, a cascode connection, or a combination thereof.

* * * * *